(12) United States Patent
Kunitomo et al.

(10) Patent No.: US 7,557,428 B2
(45) Date of Patent: Jul. 7, 2009

(54) SEMICONDUCTOR INTEGRATED CIRCUIT HAVING A REDUCED PARASITIC CAPACITANCE AND SHORT START-UP TIME

(75) Inventors: Hiroyasu Kunitomo, Chiba (JP);
Tomoaki Nimura, Chiba (JP); Isamu Kuno, Chiba (JP); Ryuji Ariyoshi, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 230 days.

(21) Appl. No.: 11/330,194

(22) Filed: Jan. 12, 2006

(65) Prior Publication Data

US 2006/0157822 A1    Jul. 20, 2006

(30) Foreign Application Priority Data

Jan. 18, 2005    (JP) ............................ 2005-010284

(51) Int. Cl.
*H01L 29/00* (2006.01)

(52) U.S. Cl. .............................. 257/533; 257/E27.045

(58) Field of Classification Search ................ 257/532, 257/533, 535, E27.009, E27.016, E27.024, 257/E27.025, E27.045
See application file for complete search history.

(56) References Cited

U.S. PATENT DOCUMENTS

| 5,773,872 | A | * | 6/1998 | Kobatake | ..................... 257/532 |
| 5,903,033 | A | | 5/1999 | Suwa | |
| 6,576,977 | B1 | * | 6/2003 | Beeman et al. | ............. 257/533 |
| 2005/0168293 | A1 | * | 8/2005 | Kato et al. | ................ 331/36 C |

FOREIGN PATENT DOCUMENTS

| JP | A-57-194562 | 11/1982 |
| JP | A-61-084048 | 4/1986 |
| JP | 63-029962 | 2/1988 |

* cited by examiner

*Primary Examiner*—Victor A Mandala
*Assistant Examiner*—Leslie Pilar Cruz
(74) *Attorney, Agent, or Firm*—Oliff & Berridge, PLC

(57) ABSTRACT

A semiconductor integrated circuit that includes a circuit element with a reduced parasitic capacitance and has a short start-up time. A well of the different type of conduction from that of the substrate is formed in the area of the surface of the semiconductor substrate under the circuit element. A constant voltage, which biases the junction between the well and the semiconductor substrate in a reverse direction, is applied to the well through a resistor having a higher impedance compared with the impedance of the capacitance of the reverse-biased junction between the well and the substrate at the frequency of the signal applied to the circuit element.

2 Claims, 3 Drawing Sheets

SEMICONDUCTOR INTEGRATED CIRCUIT HAVING A REDUCED PARASITIC CAPACITANCE AND SHORT START-UP TIME

Exemplary embodiments of this invention were first described in and claims priority from Japanese Application No. 2005-010284, which is incorporated by reference in its entirety.

BACKGROUND

Exemplary embodiments of this invention relate to a semiconductor integrated circuit including a circuit element formed over the surface of a semiconductor substrate, and a semiconductor integrated circuit having a reduced parasitic capacitance between the element and the substrate and a short start-up time.

There are types of semiconductor integrated circuit that includes, in addition to active elements such as transistors formed on the surface of a semiconductor substrate, passive circuit elements such as capacitor elements, inductor elements and resistor elements formed on the same substrate.

FIG. 3 is a schematic that shows an example of a semiconductor integrated circuit which includes such passive elements. FIG. 3 shows a circuit layout of a voltage-controlled oscillation circuit 100. The oscillation circuit in FIG. 3 includes an inverter 114, quartz oscillator 116, feedback resistor Rf, fixed capacitors C1 and C2, variable capacitors CV1 and CV2, and resistors Rc1 and Rc2. The feedback resistor Rf and the quartz oscillator 116, which are mutually connected in parallel, are connected between the input terminal and the output terminal of the inverter 114. The fixed capacitor C1 and the variable capacitor CV1 are connected in series, in this order, between the input terminal of the inverter 114 and the ground (GND). The fixed capacitor C2 and the variable capacitor CV2 are connected serially, in this order, between the output terminal of the inverter 114 and the GND.

By applying the control voltage Vc to the variable capacitors CV1 and CV2 through the resistors Rc1 and Rc2, respectively, the capacitances of the variable capacitors are controlled. As a result, the oscillation frequency of the oscillation circuit 100 changes. Therefore, in order to achieve a wide frequency range, variable capacitors of CV1 and CV2 with large widths of capacitance change controlled by the voltage Vc are necessary.

However, parasitic capacitors actually exist between each of the elements and the substrate because all the elements shown in the circuit layout of FIG. 3, except for the quartz oscillator 116, are formed on the same semiconductor substrate. Specifically, large parasitic capacitors exist between the substrate and the fixed capacitors of C1 and C2 that need big areas.

The parasitic capacitors Cp1 and Cp2, between the substrate and the fixed capacitors C1 and C2, are connected in parallel with the variable capacitors CV1 and CV2, respectively, as shown with broken lines in FIG. 3. The parasitic capacitances Cp1 and Cp2 narrow the effective widths of the capacitance change of the variable capacitors CV1 and CV2. As a result, the range of the frequency change of the oscillation circuit 100 narrows. Therefore, it is necessary to reduce the parasitic capacitances Cp1 and Cp2 in order to widen the range of the frequency change of the oscillation circuit 100.

For example, reference 1 (JP 57-194562) discloses a capacitor element that is formed on a thick oxide film, which is formed on a P well layer in a surface of an N type semiconductor substrate. Forming the P well layer reduces the influence of the parasitic capacitance. However, reference 1 does not disclose the control of the electric potential of the P well layer.

Reference 2 (JP 61-84048) discloses disposing an area where the electric potential is not applied between the capacitor element and the substrate. Specifically, for example, reference 2 discloses forming an N type area to which no electric potential is applied in a surface of a P type semiconductor substrate. As a result, reference 2 discloses that a capacitor element with a small parasitic capacitance.

FIG. 4 is a partial cross sectional view of an example of a semiconductor integrated circuit 120, that shows the application of the technologies disclosed in references 1 or 2. As shown in FIG. 4, the semiconductor integrated circuit 120 has a capacitor element 130 formed on a P-type semiconductor substrate 122 that is insulated by a field isolation film 126. The capacitor element 130 has a lower electrode 132, an upper electrode 136 and a capacitance insulation film 134 stacked, the capacitance insulation film 134 being in between the lower electrode 132 and the upper electrode 136. In the surface of the semiconductor substrate 122 under the capacitor element 130, an N well 124, which corresponds to the P well layer disclosed in reference 1 or the N type area disclosed in reference 2, is formed.

When the well 124 is not formed, the capacitor Cf of the field isolation film is connected directly between the capacitor element 130 and the substrate 122. That is, the parasitic capacitance Cp1 or Cp2, shown in FIG. 3, is equal to Cf. On the other hand, if the well 124 is formed under the capacitor element 130, a junction capacitance Cw is connected in series between the well 124 and the substrate. That is, the parasitic capacitance Cp1 or Cp2 is equal to the series capacitance of Cf and Cw. As a result, the parasitic capacitance between the capacitor element 130 and the substrate 122 may be reduced.

However, a long time is required to start up the oscillation circuit 100 when an electric potential is not applied to the well 124, as shown in reference 2. That is, a long time is required to stabilize the oscillation frequency.

After the oscillation starts, an electronic signal of the oscillation frequency is applied to the electrode of the capacitor element 130. The electric potential of the well 124 is influenced by the signal and is also changed. However, a long time is required until it arrives at a static state because only a small leakage current is supplied to the well 124 through the junction between the well 124 and the substrate 122. The difference of the electric potentials between the well 124 and the substrate 122 continues to change during the period that the potential of the well changes.

The capacitance Cw between the well 124 and the substrate 122 also changes during this period because the extension of the depletion layer changes according to the change of the difference of electric potentials between the well and the substrate. As a result, the parasitic capacitance Cp (Cp1 and Cp2 of FIG. 3) also changes. Therefore, in an oscillation circuit using the capacitor element 130 shown in FIG. 4, after the oscillation starts, the change of the oscillation frequency continues for a long time.

The change of the parasitic capacitance can be prevented by applying a constant voltage, for instance, a power-supply voltage Vdd to the well 124, and fixing the potential of the well 124. However, at the frequency of oscillation, the power-supply has low impedance. Accordingly, when the well 124 is directly connected to Vdd, the well 124 is connected to the GND through the low impedance of the power supply. In other words, the capacitance Cw between the well 124 and the substrate 122 is short-circuited at the frequency of oscillation. Therefore, the effect of reducing the parasitic capacitance by forming the well 124 is lost.

SUMMARY

Exemplary embodiments solve the above. That is, the exemplary embodiments aim to offer a semiconductor integrated circuit that includes a circuit element whose parasitic capacitance is reduced and has a short start-up time.

In order to solve the above, an exemplary embodiment provides a semiconductor integrated circuit. The semiconductor integrated circuit includes: a circuit element which constitutes a circuit of the semiconductor integrated circuit, the element being formed over a surface of a semiconductor substrate of a first conduction type and being insulated from the substrate; and a well of a second conduction type different from first conduction type formed in an area of a surface of the semiconductor substrate under the circuit element. A constant voltage, which biases a junction between the well and the semiconductor substrate in a reverse direction, is applied to the well through a resistor having a higher impedance compared to an impedance of a capacitance of the reverse-biased junction between the well and the substrate at a frequency of a signal applied to the circuit element during an operation of the circuit.

In order to solve the above, an exemplary embodiment provides an oscillation circuit. The oscillation circuit includes a capacitor element formed over a surface of a semiconductor substrate of a first conduction type, the capacitor element being insulated from the substrate, and a well of a second conduction type different from the first conduction type formed in an area of the surface of the semiconductor substrate under the capacitor element. A constant voltage, which biases a junction between the well and the semiconductor substrate in a reverse direction, is applied to the well through a resistor having a higher impedance compared to an impedance of the reverse-biased junction between the well and the substrate at an oscillation frequency of the oscillator circuit.

In order to solve the above, an exemplary embodiment provides a method of operating a semiconductor integrated circuit. The method of operating a semiconductor integrated circuit includes providing a circuit element that constitutes a circuit of the semiconductor integrated circuit over a surface of a semiconductor substrate of a first conduction type, the circuit element being insulated from the substrate; applying a signal having a frequency to the circuit element; reducing a parasitic capacitance between the circuit element and the semiconductor substrate by forming a well of a second conduction type different from the first conduction type in a area of the surface of the semiconductor substrate under the circuit element; and shortening a start-up time of the circuit by applying a constant voltage, which biases a junction between the well and the semiconductor substrate in a reverse direction, to the well through a resistor whose impedance is higher compared with an impedance of a capacitance of the reverse-biased junction between the well and the substrate at a frequency of the signal.

The parasitic capacitance can be reduced by forming a well under the element, and applying a bias to the reverse direction through a resistor that has high impedance compared with an impedance of a capacitor between a well and a semiconductor substrate. Also, the start-up time of the circuit can be reduced by fixing the electric potential of the well by applying a bias to the reverse direction.

According to exemplary embodiments, the above-mentioned circuit element may be a capacitor element, and the above-mentioned circuit may be an oscillation circuit which oscillates at the above-mentioned frequency.

According to exemplary embodiments, the second well of the above-mentioned second conduction type may be formed on the surface of the above-mentioned semiconductor substrate. On the second well, a transistor may be formed which composes the circuit in addition to the well. According to exemplary embodiments, the well has a high resistivity compared with the second well.

As a result, the parasitic capacitance can be reduced more. Moreover, at the above-mentioned frequency, the above-mentioned resistance is desirably three times or more of impedance compared with that of the capacitor between the well and the substrate which is biased to the reverse direction.

DETAILED DESCRIPTION OF EMBODIMENTS

In the semiconductor integrated circuit according to an exemplary embodiment of the present invention, the parasitic capacitance between the substrates and the circuit element can be reduced, and the start-up time of the circuit including the circuit element can be effectively reduced.

Figure 1:
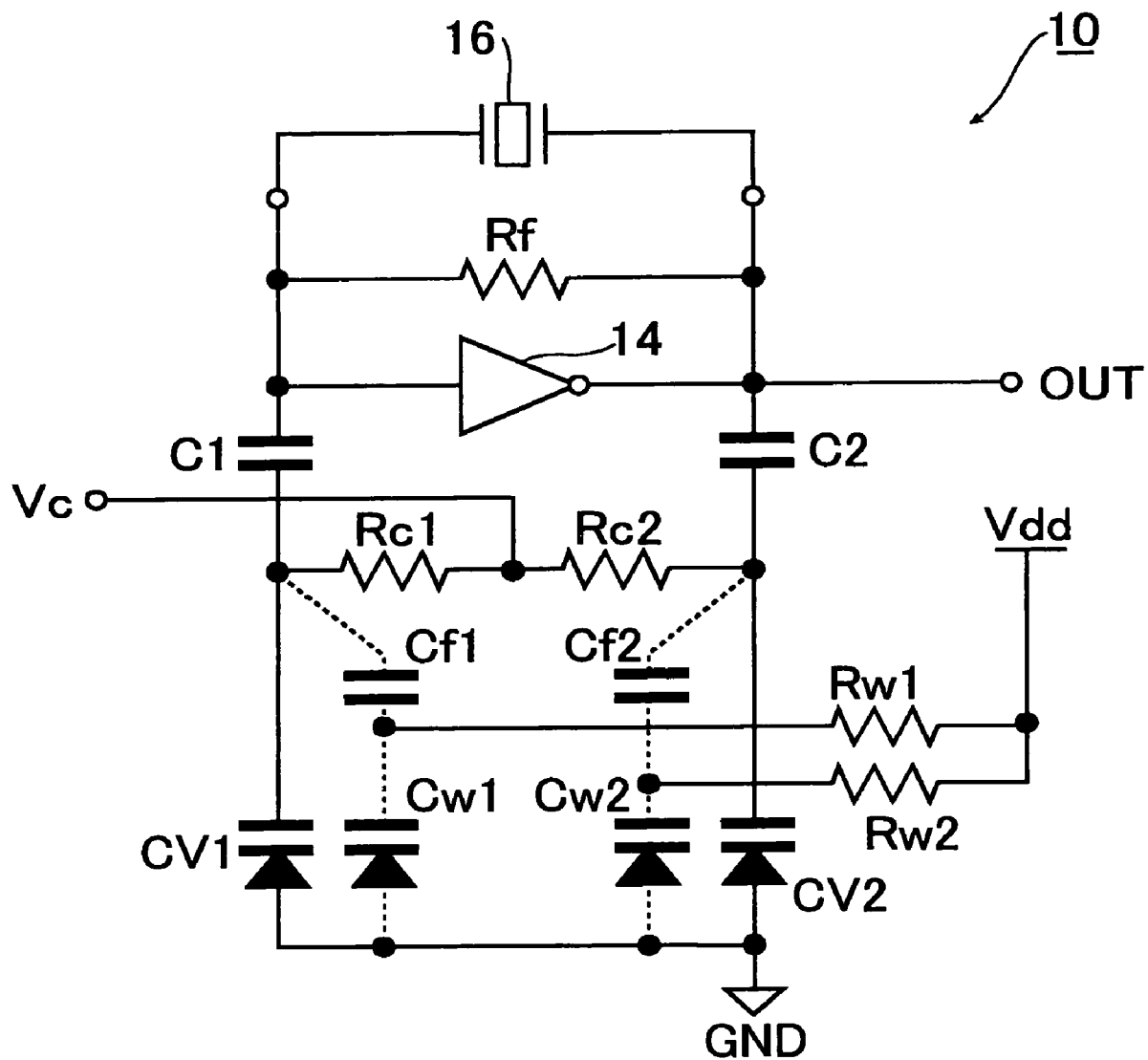
FIG. 1 is a circuit that shows an example of an oscillation circuit included in the semiconductor integrated circuit according to an exemplary embodiment of the present invention.

FIG. 1 is a circuit that shows an example of a circuit included in an exemplary semiconductor integrated circuit according to an exemplary embodiment of the present invention.

The circuit shown in FIG. 1 is a voltage-controlled oscillation circuit 10 that includes capacitor elements C1 and C2. The composition is basically the same as the related oscillation circuit 100 shown in FIG. 3. That is, a feedback resistance Rf and a quartz oscillator 16 are connected in parallel between the input terminal and the output terminals of an inverter 14. A fixed capacitor C1 and a variable capacitor CV1 are also connected in series, in this order, between the input terminal of the inverter 14 and the GND, and a fixed capacitor C2 and a variable capacitor CV2 are connected in series, in this order, between the output terminal of the inverter 14 and the GND.

Figure 3:
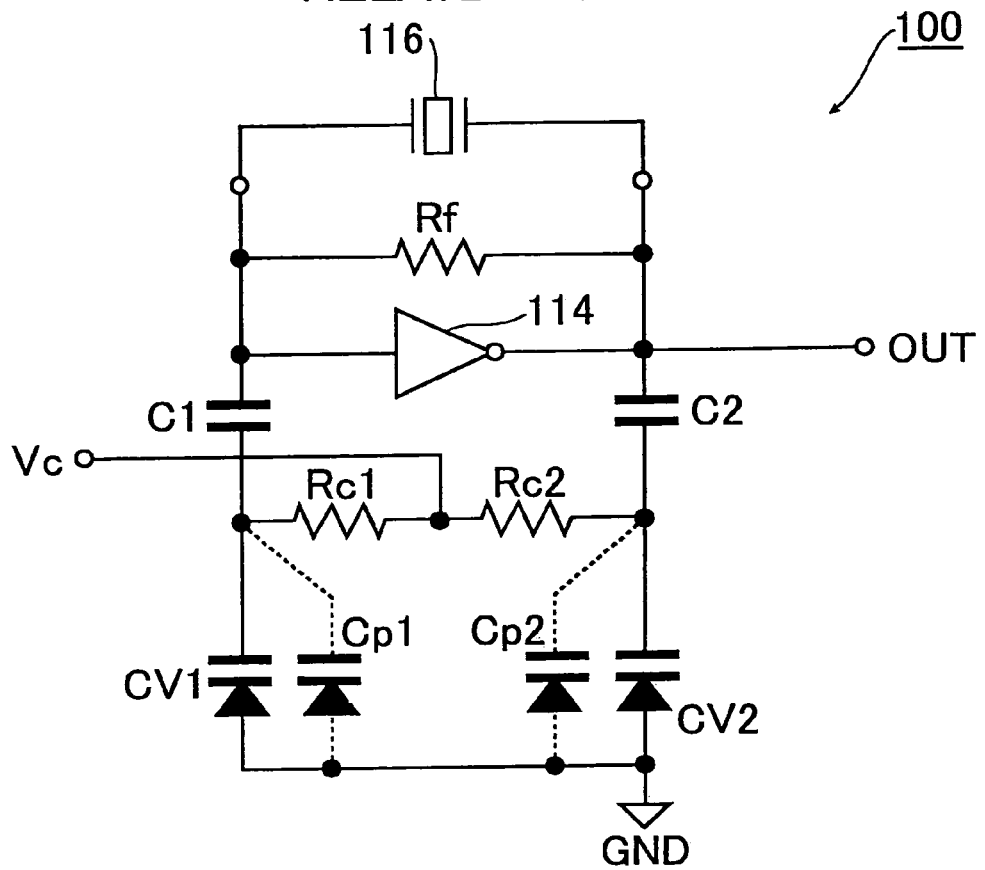
FIG. 3 is a circuit that shows one example of an oscillation circuit included in a related art semiconductor integrated circuit.
Figure 4:
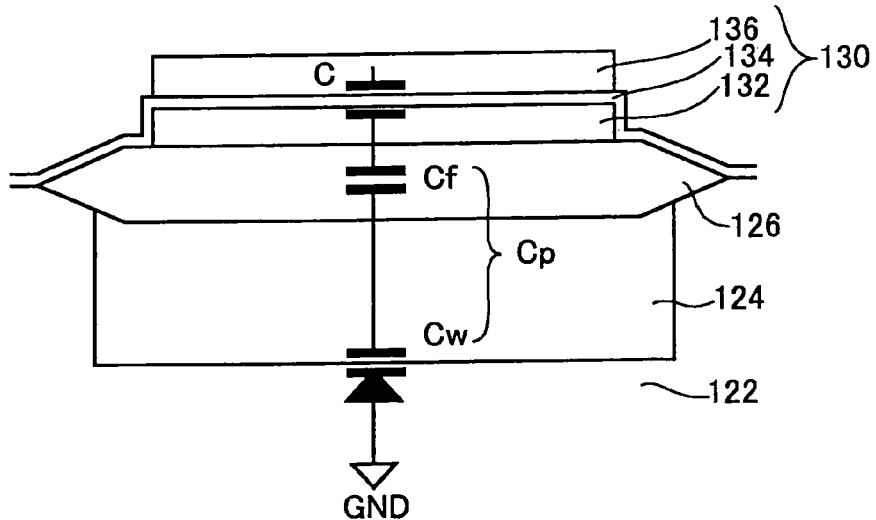
FIG. 4 is a cross sectional view of a part of a related art semiconductor integrated circuit.

In FIG. 1, however, the parasitic capacitance, which is collectively shown as Cp (Cp1, Cp2) in FIG. 3, is divided into two components. That is, the capacitance Cp (Cp1, Cp2) is shown as a series capacitance of the capacitance Cf (Cf1, Cf2) of the field isolation film and the capacitance Cw1 or Cw2 of the junction between the well and the substrate. The voltage-controlled oscillation circuit 10 of the present invention is different from the oscillation circuit 100 in FIG. 3, because a constant voltage, more concretely, a power-supply voltage Vdd is applied through resistors Rw1 and Rw2 at the middle point between the capacitance of Cf1 and Cf2 of the field isolation film and the capacitance of Cw1 and Cw2 of the junction, between the well and the substrate, respectively.

Figure 2:
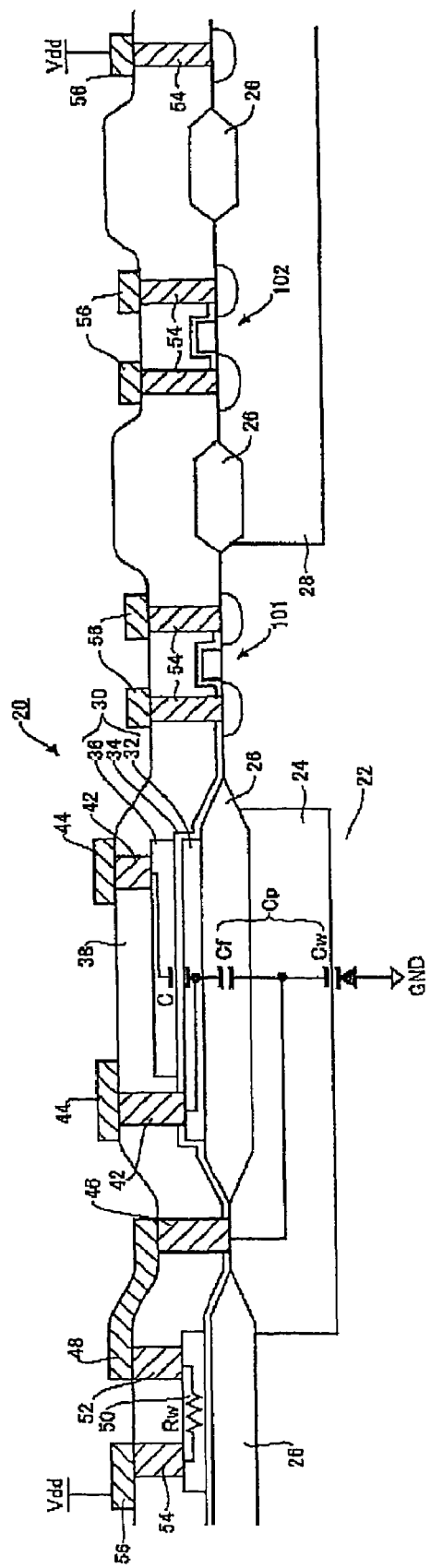
FIG. 2 is a cross sectional view of a part of an exemplary semiconductor integrated circuit according to an exemplary embodiment of the present invention.

FIG. 2 is a partial cross sectional view of the semiconductor integrated circuit 20 that includes the circuit 10 shown in FIG.

1. Specifically, FIG. 2 is a partial cross sectional view where capacitor element 30, which constitutes the capacitor C1 or C2, is formed. Moreover, capacitances and resistance formed in the structure are shown in FIG. 2. For instance, C corresponds to either C1 or C2 shown in FIG. 1. Similarly, Cf and Cw correspond to either Cf1 or Cf2, and Cw1 or Cw2 of FIG. 1, respectively.

The capacitor element 30 is formed by stacking a lower electrode 32 and an upper electrode 36 through a capacitor insulation film 34 on a field isolation film 26 formed on the surface of a semiconductor substrate 22. The lower electrode 32 and the upper electrode 36 may be formed of poly-silicon films. The field isolation film 26 may be formed in the same process for forming the field isolation films that isolate between other circuit elements, such as transistors, on other parts of the semiconductor integrated circuit 20. The field isolation film may be formed with a related art, a later art or a well-known LOCOS (LOCal Oxidation of Silicon) method. The capacitor insulation film 34 may be formed by depositing a silicon oxide film with a CVD method, for example.

Over the upper electrode 36, an interlayer insulation film 38 is formed to cover the whole surface of the semiconductor substrate 22 on which the capacitor element 30 is formed. Contact holes 42 are opened at a predetermined position of the interlayer insulation film 38 and the capacitor insulation film 34. The capacitor element 30 is connected to wirings 44 at the contact holes 42.

In the surface of the semiconductor substrate 22, a well 24 having a different conduction type than that of the substrate 22 is formed in the area under the capacitor element 30. In the circuit shown in FIG. 2, an N well 24 is formed in the surface of the P type semiconductor substrate 22. The substrate 22 is connected to GND through a contact hole, which is not shown in the figure. Therefore, the junction between the N well 24 and the substrate 22 is biased to the reverse direction by applying the Vdd voltage to the N well 24.

Between the lower electrode 32 of the capacitor element 30 and the well 24, a capacitance Cf of the field isolation film 26, which is a capacitance between the lower electrode 32 and the well 24 that are placed oppositely across the field isolation film 26, is connected. A capacitance Cw of the PN joint between the well 24 and the substrate 22 is also connected between the well 24 and the substrate 22. That is, the capacitor C of the capacitor element 30 is connected to GND through a parasitic capacitance, which is formed by a serial connection of the capacitance Cf of the field isolation film, and the capacitance Cw of the junction between the well 24 and the substrate 22, as shown in FIG. 2.

Furthermore, in the N well 24 of the semiconductor device 20 of the exemplary embodiment shown in FIG. 2, the N well 24 under the capacitor element 30 extends to a position outside of the field isolation film 26, and a contact hole 46 is formed on the extended portion of the N well 24. The N well 24 is also connected to a resistor element 50 through the contact hole 46, the wiring 48, and the contact hole 52. The resistor element 50 is connected to the power supply Vdd through the contact hole 54 and the wiring 56.

Therefore, as shown in FIG. 2, the middle point between Cf and Cw is effectively connected to a constant voltage (Vdd) through a resistance Rw of the resistor element 50, which corresponds to Rw1 or Rw2 in FIG. 1. Here, the resistor Rw has higher impedance at the oscillation frequency of the oscillation circuit 10 compared with the impedance of the capacitance Cw between the well 24 and the substrate 22. Specifically, it is desirable that the resistor Rw has ten times or more of the impedance of the Cw at the oscillation frequency.

In the surface of the semiconductor substrate 22, N wells are formed in the areas not shown in FIG. 2, in addition to the N well 24 formed under capacitor element 30. Other circuit elements, such as P-type transistors, are formed in these N wells. These other N wells can be formed in the same process for forming the N well 24 under the capacitor element 30. However, the N wells, within which the P-type transistors are formed, are connected directly to Vdd. Therefore, in order to apply the voltage through the resistor Rw, the N well 24 under the capacitor element 30 is formed separately from these other N wells.

Furthermore, the N wells 24 are respectively formed under the two capacitor elements 30, which constitute the fixed capacitors C1 and C2, in the voltage-controlled oscillation circuit 10 shown in FIG. 1. The Vdd voltage is also applied to the two N wells 24 through the separate resistor elements 50 formed of respective resistors Rw, as shown in FIG. 1.

If the N wells 24 are formed commonly for the capacitors C1 and C2, or the voltage is applied to the capacitors C1 and C2 through a common resistor Rw in the oscillation circuit 10 shown in FIG. 1, a capacitor, which is formed in series by the C1, C2 and Cf of the field isolation film 26, is connected between the terminals of the crystal oscillator 16. As a result, the oscillation may be unstable.

It is desirable that the well 24, which is formed under the element 30, extends to the whole area under the element or further extends to a wide area, as shown in FIG. 2. As a result, the parasitic capacitance can be effectively reduced.

The semiconductor integrated circuit according to the present invention will be further explained as follows in reference to an exemplary embodiment.

According to the following processes, an exemplary semiconductor integrated circuit including the voltage-controlled oscillation circuit 10 shown in FIG. 1, which has the sectional structure shown in FIG. 2, is formed.

A silicon substrate having a P-type epitaxial layer with an resistivity of 10 Ωcm may be used as the semiconductor substrate 22. In the surface of the substrate, an N well 24 is formed at the position under the area where the capacitor element 30 will be formed in the following process. At the same time, N wells for forming P-type MOS transistors are formed. A field isolation film 26 of 500 nm in thickness may also be formed with the LOCOS method. Other necessary elements for the semiconductor integrated circuit 20, such as N type MOS transistors, P type MOS transistors and variable capacitors, etc (not shown in FIG. 2), which are isolated with each other by the field isolation film 26, are formed on the surface of the semiconductor substrate 22.

At the same time the gate electrode of these transistors is formed, a lower electrode 32 of the capacitor element 30 is formed on the field isolation film 26, which is formed on the N well 24, by utilizing a first poly-silicon film. Then, a capacitor insulation film 34 of 35 nm in thickness is formed by a CVD method and the upper electrode 36 is formed utilizing a second poly-silicon film. As a result, a capacitor element 30 is formed. Moreover, a resistor element 50 is formed by utilizing the second poly-silicon film.

The area of the lower electrode 32 and the upper electrode 36 of the capacitor element 30 is about 0.06 mm$^2$. The resistance of the resistor element 50 is about 100 kΩ. Areas of the second poly-silicon film for forming the upper electrode 36 and the resistor element 50 are separately doped with different impurity concentrations. Therefore, each of the areas has its appropriate sheet resistances.

In addition, an interlayer insulation film 38 is formed by a CVD method on the whole surface of the semiconductor substrate 22, on which these elements are formed. Contact holes 42, 46, 52 and 54 are also formed at required places, as well as wirings 44, 48 and 56 are formed.

In the above-mentioned semiconductor integrated circuit 20, the capacitance of Cf of the field isolation film, which is measured as the capacitance between the lower electrode 32 of the capacitor element 30 and the N well 24, is about 3.5 pF. Moreover, a reverse-bias voltage is applied between the N well 24 and the substrate 22, by connecting the substrate 22 to the GND and the N well 24 to Vdd, i.e., 3.3 V. Under this situation, the capacitance Cw of the junction between the N well 24 and the substrate 22 is about 7 pF. Therefore, the parasitic capacitance between the substrates 22 and the capacitor element 30 is equal to the capacitance formed by the Cf and Cw connected in series. It is about 2.3 pF.

On the other hand, if the N well 24 is not formed in the area under the capacitor element 30, the parasitic capacitance between the capacitor element 30 and the substrate 22, which is the capacitance of the field isolation film, is considered to be approximately equal to the capacitance between the lower electrode 32 and the N well 24. Therefore, the parasitic capacitance of the capacitor element 30 can be reduced by 30% or more by forming the N well 24.

Next, the start-up time of the oscillation circuit 10 formed by the above mentioned method is measured. Specifically, a switch that connects the input of an inverter 14 of the oscillation circuit 10 to the GND, which is not shown in FIG. 1, is installed. After the switch is closed to stop the oscillation, the switch is opened. An interval is also measured until the frequency of the oscillation is stabilized within ±0.5 ppm of the value of the static state, which is about 27 MHz.

It was revealed that the start-up time of the oscillation circuit 10 of the present invention is 1.4 ms or less at room temperature.

The oscillation circuit 10 may be used as a TCXO (temperature compensation crystal oscillator) for generating a reference frequency of a cellular phone, for example, which demands a start-up time within about 2 ms. Moreover, the start-up time of the oscillation circuit 10 is about several ms, when the oscillation circuit is used, for example, for generating a reference frequency for a MPEG decoder of a DVD device. The measured start-up time of the oscillation circuit 10 according to the exemplary embodiment of the present invention is short, and fulfills these specifications.

Comparatively, the start-up time of the same voltage-controlled oscillation circuit 10 is measured in a state that a resistor Rw is not connected to anywhere. As a result, the start-up time is a few seconds. That is, the oscillation frequency is observed to be fluctuated for a few seconds after the oscillation starts.

From the above-mentioned comparison, by applying a voltage, which biases the junction between the well 24 under the capacitor element 30 and the substrate 22 in the reverse direction, to the well 24 through a resistor Rw, the electric potential of the N well 24 is fixed and the start-up time is greatly shortened.

Here, if the capacitance Cw between the well 24 and the substrate 22 is within the range of 3-7 pF, and the oscillation frequency is within the range of 10-100 MHz, then the impedance of Cw is about 5 kΩ at the highest, when the capacitance is the smallest and the frequency is the lowest within the ranges. In this exemplary example, the impedance of the resistor Rw, i.e., is 100 kΩ at the highest. That is, the impedance of the resistor Rw is about 20 times higher compared with the highest impedance of Cw. Therefore, even if the well 24 is connected with Vdd through the resistor Rw, the effect of the parasitic capacitance is substantially the same as when the well 24 is not connected to Vdd.

Further, by applying Vdd voltage to the well 24, the changeable range of the oscillation frequency of the oscillation circuit 10 expands. Specifically, the changeable range of the oscillation frequency by changing the control voltage Vc within the range of 0-3.3 V can be expanded by about 12% by applying Vdd voltage to the well 24. The reason is thought to be that the depletion layer between the well 24 and the substrate 22 further extends by fixing the electric potential of the well 24 to Vdd. That is, when the well 24 is not connected to anywhere, where the electric potential of the well 24 depends on the leakage current, fixing the electric potential of the well 24 to the Vdd voltage further extends the depletion layer, and reduces the capacitance Cw between the well 24 and the substrate 22.

The value of the resistor Rw for supplying the constant voltage to the well 24 is usually at least three times or more, or desirably ten times or more higher compared to the impedance of the capacitor between the well 24 and the substrate 22 at the oscillation frequency of the oscillation circuit 10.

The resistance Rw can be further increased within the range where a necessary start-up time can be obtained.

In the above-mentioned example, the RC time constant determined by the value of the resistance Rw (100 kΩ) and the value of the capacitance Cw (7 pF) is 1 µs (microsecond) or less. This time constant is far shorter than the measured start-up time of about 1.4 ms (millisecond). It is thought that the start-up time is determined by other factors. Therefore, it is thought that the start-up time will not become remarkably longer even if the resistance Rw is further increased, and the time constant is increased at least within a range that the time constant is far shorter than the necessary start-up time.

For example, the RC time constant that is determined by the resistance Rw and the capacitance Cw may be set to about 1/10 or less of the required start-up time. If the required start-up time is about 1 ms or less, for example, the RC time constant should preferably be about 100 µs or less.

However, it is not desirable to use a much higher resistor than required, because it is a waste of area to form a resistor of such a high resistance. At most, the resistance of the resistor Rw is usually set within the range that the impedance of the resistor Rw is about 100 times of the impedance of the capacitor between the well 24 and the substrate 22 at the oscillation frequency.

Thus far, exemplary semiconductor integrated circuits are explained with reference to an exemplary embodiment. However, the present invention is not limited to the above-mentioned exemplary embodiments. For example, the present invention is not limited to an oscillation circuit, and can be applied to semiconductor integrated circuits including various kinds of circuits. Specifically, this invention may be advantageously applied to semiconductor integrated circuits including capacitor elements where the parasitic capacitances between the capacitor element and the substrate influence the characteristics of the circuit. Moreover, when the invention is applied to integrated circuits including oscillation circuits, the circuit construction is not limited to the example shown in FIG. 1.

In the oscillation circuit 10 shown in FIG. 1, during operation, the signal of the oscillation frequency is applied to the capacitors C1 and C2. Therefore, the value of the resistor through which the voltage is applied to the well, is set considering the impedance of the capacitance between the well and the substrate at the frequency of the oscillation. In order to reduce the parasitic capacitance of a circuit element in a circuit other than the oscillation circuit, or the parasitic capacitance of an element other than the capacitor element, the value of the resistor can be set in consideration of the impedance of the capacitance between the well and the substrate at the frequency of the signal applied to that element.

The well formed under the element is not limited to an N well in the surface of a P type semiconductor substrate. It is also possible to form a P well in the surface of an N type semiconductor substrate. In this case, the well may be connected to GND through a resistor of an appropriate value, while connecting the substrate to Vdd.

It is not indispensable for the exemplary embodiment of the present invention to supply the voltage of Vdd or GND to the well. Various voltages may be supplied, according to the necessity in each circuit, within the range that the junction between the well and the substrate is reversely biased. Moreover, it is also possible to supply the voltage of high stability from a voltage regulator. Thereby, an instability caused by the instability of the power-supply voltage can be reduced.

It is not indispensable for the exemplary embodiment of the present invention to form the well under the capacitor element simultaneously with forming the well for forming other elements in the semiconductor integrated circuit 20. Decreasing the impurity concentration or increasing the resistivity of the well increases the width of the depletion region of the junction between the well and the substrate, and decreases the capacitance of the junction. Therefore, the effect of reducing the parasitic capacitance can be improved by increasing the resistivity of the well under the capacitor element. However, the resistivity of the wells for forming the transistors is usually optimized for improving the transistor characteristics. Accordingly, it is preferable to make the well under the circuit element have a higher resistivity than the resistivity of the wells for forming the transistors.

In the exemplary embodiment explained above, a resistor formed of a poly-silicon film is used for supplying the voltage to the well. However, different types of resistors may also be used. For example, it is also possible to form the resistor element in the well by making the shape of a portion of the well long and narrow.

In the exemplary embodiment explained above, the parasitic capacitance of a capacitor element is reduced and the start-up time of the circuit is shortened by supplying a constant voltage to a well formed under the capacitor element through a resistor. The same effect of reducing the parasitic capacitance and shorten the start-up time may be obtained for other circuit elements. Therefore, the exemplary embodiment of the present invention can be applied to various other semiconductor integrated circuits including various other passive circuit elements, such as resistor elements or inductor elements. Specifically, the exemplary embodiment of the present invention may be applied particularly advantageously when the characteristic of the circuit is similarly improved by the reduction of the parasitic capacitance of a circuit element.

Moreover, the exemplary embodiment of the present invention may also be applied to reduce a parasitic capacitance of an active element and shorten the start-up time. For example, a well may be formed under a transistor forms in a semiconductor-on-insulator (SOI) layer and a constant voltage may supplied to the well such that the junction between the well and the substrate is biased in the reverse direction.

What is claimed is:

1. A semiconductor integrated circuit, comprising:
   a circuit element which constitute a circuit of the semiconductor integrated circuit, the circuit element being formed over a surface of a semiconductor substrate of a first conduction type and being insulated from the substrate;
   a well of a second conduction type different from the first conduction type formed in an area of a surface of the semiconductor substrate under the circuit element; and
   a second well of the second conduction type in which a transistor, which constitutes the circuit, is formed in the surface of the semiconductor substrate, wherein the well has a higher resistivity than a resistivity of the second well;
   wherein a constant voltage, which biases a junction between the well and the semiconductor substrate in a reverse direction, is applied to the well through a resistor having a higher impedance compared with an impedance of a capacitance of the reverse-biased junction between the well and the substrate at a frequency of a signal applied to the element during an operation of the circuit.

2. An oscillation circuit, comprising:
   a capacitor element formed over a surface of a semiconductor substrate of a first conduction type, the capacitor element being insulated from the substrate;
   a well of a second conduction type different from the first conduction type formed in an area of the surface of the semiconductor substrate under the capacitor element; and
   a transistor formed in a second well of the second conduction type formed in the surface of the semiconductor substrate, wherein the well has a higher resistivity than a resistivity of the second well;
   wherein a constant voltage, which biases a junction between the well and the semiconductor substrate in a reverse direction, is applied to the well through a resistor having a higher impedance compared with an impedance of the reverse-biased junction between the well and the substrate at an oscillation frequency of the oscillator circuit.

\* \* \* \* \*